United States Patent [19]
Koyama

[11] Patent Number: 5,457,816
[45] Date of Patent: Oct. 10, 1995

[54] SCANNING RECEIVER WITH STORED FREQUENCIES

[75] Inventor: Kazuo Koyama, Tokyo, Japan

[73] Assignee: Clarion Co., Ltd., Tokyo, Japan

[21] Appl. No.: 86,135

[22] Filed: Jul. 1, 1993

[30] Foreign Application Priority Data

Jul. 1, 1992 [JP] Japan ..................................... 4-197651
Apr. 14, 1993 [JP] Japan ..................................... 5-109771

[51] Int. Cl.⁶ ..................................................... H04B 1/16
[52] U.S. Cl. ................................... 455/161.2; 455/161.3; 455/186.1
[58] Field of Search .............................. 455/161.1, 161.2, 455/161.3, 164.1, 164.2, 165.1, 166.1, 166.2, 167.1, 168.1, 186.1

[56] References Cited

U.S. PATENT DOCUMENTS 3,962,644  6/1976  Baker .
5,303,400  4/1994  Mogi ..................................... 455/161.3
5,307,513  4/1994  Harada ................................. 455/166.2

Primary Examiner—Reinhard J. Eisenzopf
Assistant Examiner—Thanh Le
Attorney, Agent, or Firm—Koda and Androlia

[57] ABSTRACT

Receivable frequencies based on a predetermined instruction signal are scanned in a first direction and across a frequency range extending from a first start frequency to a first end frequency. The tuning is retraced to the first start frequency, and scanning is resumed in the opposite direction across a second frequency range extending from the first start frequency to a second end frequency. Next, tuning is retraced to the second start frequency and scanning is resumed in the first direction across a third frequency range extending from the first end frequency to a third end frequency. The scan operation is repeated until predetermined upper and lower frequency limits are reached. When one of the frequency limits are reached, scanning is performed for one or more frequency ranges in the opposite direction without retrace until the second frequency limit is reached.

11 Claims, 8 Drawing Sheets

SCANNING RECEIVER WITH STORED FREQUENCIES

BACKGROUND OF THE INVENTION

The present invention relates to receivers. Specifically, the present invention relates to receivers which have a seek and a scan operation for receivable frequencies.

Receivers which have seek and scan capabilities are known in the prior art. For example, car radios have seek and scan operations. The seek operation automatically searches for a frequency having a good signal-to-noise ratio (strong signal) and stops a search at the first frequency with such good ratio. The scan operation automatically searches for a frequency having a good signal-to-noise ratio and stops temporarily at each such good ratio.

The Radio Data System (hereinafter referred to as RDS) broadcasting system exists in Europe. The RDS contains Program Identification Codes (hereinafter referred to as PI codes) which identify the programming content of each radio station. Many European radio stations have similar programming contents. The scan and seek operations in conjunction with the PI code permit the listener to search for a stronger signal with the same programming content.

The disadvantage of the prior art is that scan and seek operations are limited, slow and inefficient. Scan and seek operations used in conventional receivers and RDS receivers move in either the upward or downward direction from a present frequency to one end of the band, and then continue in the same direction from the opposite end of the band. In other words, the scan operation moves unidirectionally. If the scan operation moves in only one direction, it takes a long time to search for a signal with a good signal-to-noise (strong signal) ratio that is located nearby in an opposite direction of where the scan began.

Another disadvantage of the prior art is that in conventional receivers without PI codes, an operator must listen to each station in order to choose a particular program. In RDS receivers, an operator uses PI codes to search for a particular program, but it takes a long time to locate the strongest signal because the scan operation moves unidirectionally.

OBJECTS AND SUMMARY OF THE INVENTION

It is accordingly an object of the present invention to overcome the drawbacks of the prior art.

It is further an object of the present invention to provide an improved seek and scan system.

It is a still further object of the present invention to provide an improved RDS receiver capable of efficiently scanning the frequency range to find another frequency having a stronger signal with the same program.

Receivable frequencies based on a predetermined instruction signal are scanned in a first direction and across a frequency range extending from a first start frequency to a first end frequency. The tuning returns to the first start frequency, and scanning begins in the opposite direction across a second frequency range extending from the first start frequency to a second end frequency. Next, tuning is readjusted to a second start frequency. The tuning is scanned in a third direction opposite to the second direction across a third frequency range extending from the first end frequency to a third end frequency. The scan operation is repeated until a predetermined upper and lower tuning limits are reached.

Briefly stated, receivable frequencies based on a predetermined instruction signal are scanned in a first direction and across a frequency range extending from a first start frequency to a first end frequency. The tuning is retraced to the first start frequency, and scanning is resumed in the opposite direction across a second frequency range extending from the first start frequency to a second end frequency. Next, tuning is retraced to the second start frequency and scanning is resumed in the first direction across a third frequency range extending from the first end frequency to a third end frequency. The scan operation is repeated until predetermined upper and lower frequency limits are reached. When one of the frequency limits is reached, scanning is performed for one or more frequency ranges in the opposite direction without retrace until the second frequency limit is reached.

According to an embodiment of the invention, there is provided a receiver for tuning receivable frequencies, comprising means for tuning the receiver in a first direction from a first frequency to a first limit and means for retracing the tuning to the first frequency, and then for resuming tuning from the first frequency in a second direction, opposite the first direction, to a second limit.

According to a further embodiment of the invention, there is provided a radio system comprising an FM receiver, the FM receiver being of a type to produce an audio frequency signal, means for decoding a radio data system signal from the audio frequency signal, a controller, the controller including means for storing a signal strength of a radio signal received by the FM receiver, the controller including means for controlling a tuning frequency of the FM receiver, the controller including means for sensing a desired program identification (PI) code in the radio data system signal, and the controller including means for scanning an FM frequency band and, when a suitable signal strength and the desired program identification code are both present, of taking an action in response thereto.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
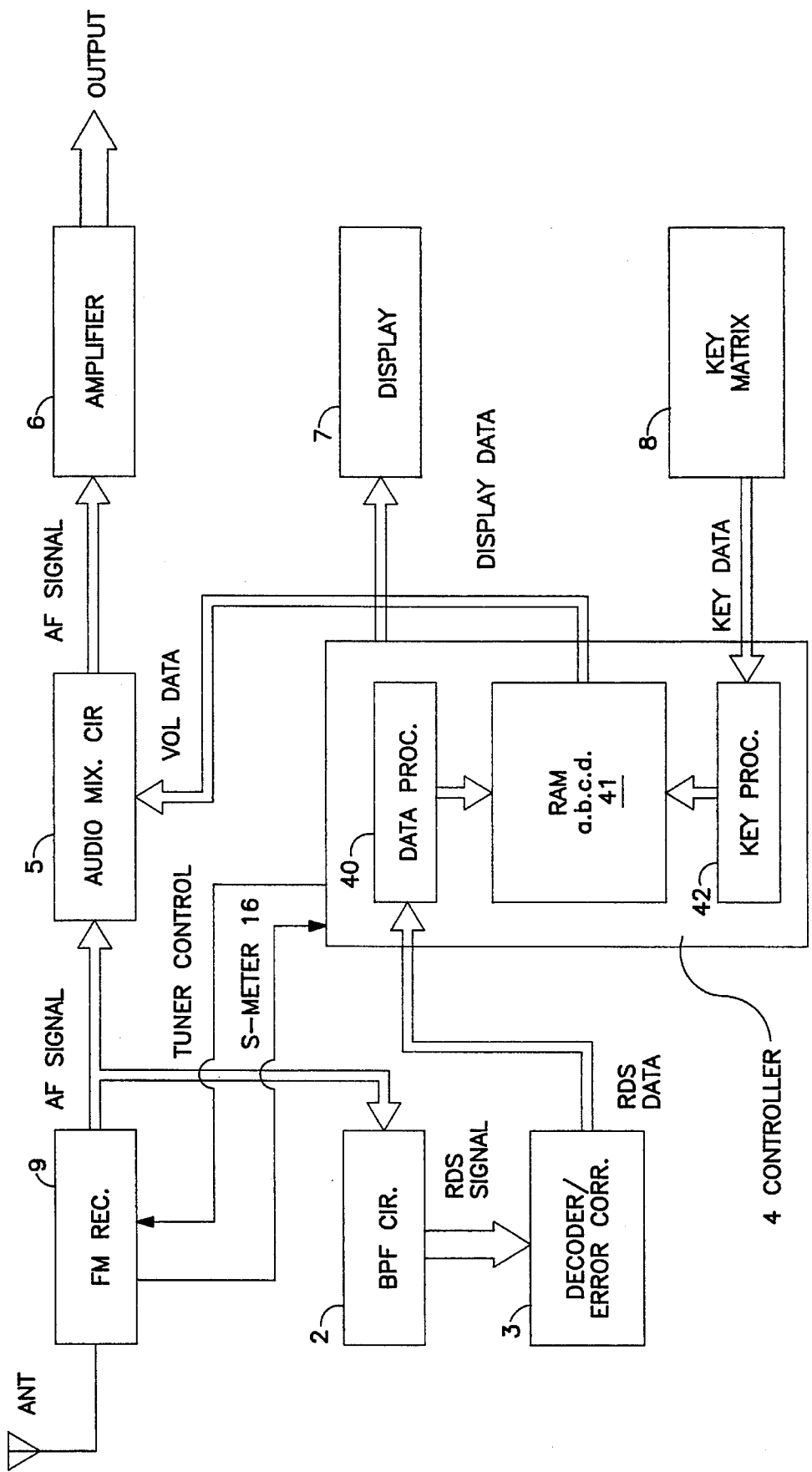
FIG. 1 is a block diagram of a preferred embodiment of the present invention.

Referring to FIG. 1, a frequency modulation (FM) receiver 1 connected to an antenna 9 reproduces an audio frequency (AF) signal present in a transmitted wave. A microprocessor based controller 4 controls the tuning of FM receiver 1 and the volume of a demodulated AF signal. The demodulated AF signal is volume controlled in an audio output mixing circuit 5. The volume controlled AF signal is applied to an amplifier 6. An amplified output from amplifier 6 is applied to a speaker (not shown).

The AF signal from FM receiver 1 also contains a Radio Data System (RDS) signal. The RDS signal is band-pass filtered in a band-pass filter (BPF) circuit 2 to select the portion of the AF signal containing the RDS content and to remove undesired frequencies, such as audible frequencies containing program material. An output of BPF circuit 2 is applied to an RDS signal decoder/error correction circuit 3 which produces digital RDS data for application to controller 4. Controller 4 controls the tuning of FM receiver 1 and the volume of the demodulated AF signal produced by audio output mixing circuit 5.

Controller 4 contains an RDS data processing area 40, a random access memory (RAM) 41, and a key processing area 42. Controller 4 sends suitable display data to a display 7. For example, display data may be a band, a frequency, RDS data, a signal strength or a time. A key matrix 8 is used by an operator to input instructions as key data to key matrix 8, which supplies the key data to controller 4. In response to the key data output from key matrix 8, controller 4 can apply a tuning control signal to FM receiver 1, change the volume control data applied to audio output mixing circuit 5, or change the display data exhibited on display 7.

An S-meter (not shown) within FM receiver 1 feeds an S-meter signal to controller 4. The S-meter signal has an amplitude that is proportional to the strength of a received signal. Controller 4 uses the S-meter signal to detect a station and sends display data to display 7. Controller 4 also determines the frequency having the highest signal-to-noise ratio (strongest signal). Finally, controller 4 determines what volume control data is sent to audio output mixing circuit 5.

Whenever FM receiver 1 is tuned past an FM station having a detectable signal, FM receiver 1 produces an S-meter signal on a line 16 having an amplitude proportional to the strength of the received signal. The S-meter signal on line 16 is applied to controller 4. When the received signal strength exceeds a predetermined value, the S-meter signal is interpreted to be a detect (hereinafter "SD") signal which indicates whether or not a station with sufficient signal strength is received by FM receiver 1. When a particular station is being listened to, the system responds to the SD signal by remaining tuned to the particular station. When scanning, the system responds to the SD signal to recognize candidate stations, which are then investigated to determine whether their PI codes are the same as the PI code being sought, and if so, by storing the frequency and S-meter reading of such station.

Scanning can be terminated, either when a sufficiently strong signal is received (seek), or when a predetermined scanning pattern is completed (scan). In the seek case, the selected station is tuned. In the scan case, the signal strength and frequency of the strongest received signal is stored, and at the end of scanning, tuning is returned to the stored frequency of the strongest received signal. Also, the signal strength of the strongest received signal is used as a volume control signal, so that when a strong signal is tuned after listening to a weak signal, blasting of the radio speaker is avoided.

Figure 2:
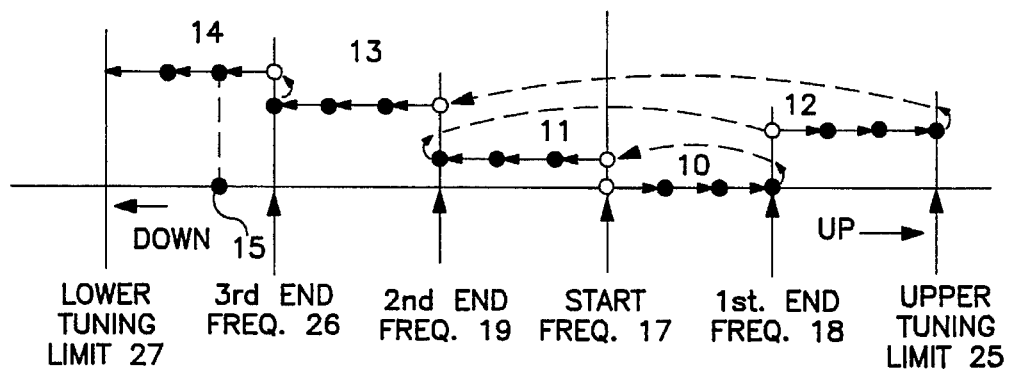
FIG. 2 is a tuning sequence diagram illustrating the operation of a first embodiment of the present invention, starting from a frequency above the center of the band.

Referring to FIG. 2, a scanning pattern is shown in which FM receiver 1 begins at a start frequency 17, to which FM receiver 1 is initially tuned. It is noted that start frequency 17 is located above the center of the tuning range of FM receiver 1. FM receiver 1 is scanned upward over a predetermined first upward scanning range 10. During this scanning, the generation of an SD signal at discrete frequencies, indicated by black dots, triggers the scrutiny of the signal for the desired PI code in the RDS data. Whenever the desired PI code is detected, the corresponding frequency and S-meter signals are stored in RAM 41 of controller 4.

If the system is set to seek mode, controller 4 determines whether the signal contains the desired PI code, and whether the S-meter signal exceeds a predetermined threshold value. If the predetermined threshold value is exceeded at, for example, a station 15, scanning is halted, and FM receiver 1 remains tuned to this station, which broadcasts the desired program content that is being received at an acceptable signal strength.

If the system is set to scan mode, scanning continues after each SD signal until a first end frequency 18 is reached. Then tuning is retraced downward to start frequency 17, and is resumed over a first downward scanning range 11. As before, the signal content is investigated each time an SD signal is generated. Scanning continues until a second end frequency 19 is reached. Tuning is retraced upward to first end frequency 18, and is then resumed over a second upward scanning range 12, until an upper tuning limit 25 is reached. The fact that upper tuning limit 25 is reached is remembered by the system for subsequent operations. Tuning is again retraced downward to second end frequency 19, and is then resumed downward over second downward scanning range 13 until a third end frequency 26 is reached. The remembered fact that upper tuning limit 25 was reached in a preceding operation initiates a further downward tuning operation over a third downward scanning range 14. Downward tuning continues over as many downward tuning ranges as necessary (one is shown) until a lower tuning limit 27 is reached.

During the above scanning operation, whenever the existing S-meter signal exceeds the stored S-meter signal, the existing S-meter signal and its accompanying frequency are stored in RAM 41. At the end of the complete scanning operation, the values stored in RAM 41 are the S-meter signal and the frequency of the strongest received signal having the desired PI code. Tuning is then adjusted to this strongest received signal.

A combination of seek and scan modes may be employed. In this combination mode, the frequency of the strongest station is stored as above. However, if a strong enough station is received, scanning is stopped. If a strong enough station is not received, tuning is repositioned to the strongest station having the desired PI code, even though it may not meet the strength criterion to stop the scanning during the scanning operation.

If while listening to a station, vehicle motion or fading reduces the station signal strength below a predetermined value, controller 4 may initiate scanning to find another station having a strong-enough signal strength and the same PI code as the faded-out station. This permits continued enjoyment of the same program during the realities of mobile radio listening.

Figure 3:
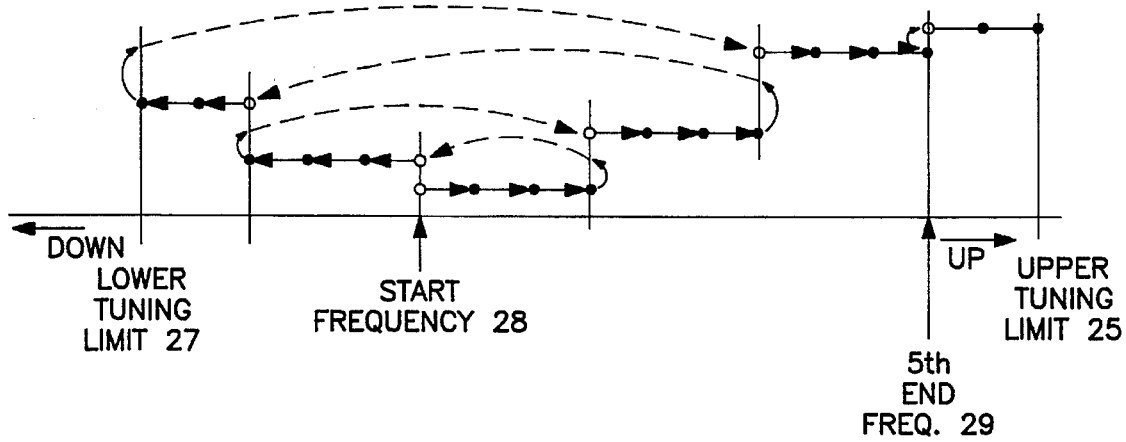
FIG. 3 is a tuning sequence diagram illustrating the operation of the first embodiment of the present invention, starting from a frequency below the center of the band.

Referring to FIG. 3, a tuning sequence is shown in which the originally tuned station is at a start frequency 28 located in the lower half of the frequency band. This tuning sequence is identical to the sequence in FIG. 2, except that since the starting point is in the lower half of the frequency band, lower tuning limit 27 is reached before upper tuning limit 25. Thus, in this sequence, the fact that lower tuning limit 27 was reached is used after attaining a fifth end frequency 29, to continue tuning upward over one or more upward tuning ranges until upper tuning limit 25 is attained.

The scan sequence of FIG. 3 can be used in seek, scan or combination seek/scan in the same manner as the scan sequence of FIG. 2.

In the embodiment of FIGS. 2 and 3, it is preferable to make the upper and lower frequency limits equal to the frequency bandwidth of the band tuneable by FM receiver 1.

The usefulness of the band scanning sequences described above is not limited to RDS receivers. One skilled in the art would recognize that the same sequences would be useful for scanning conventional receivers. In such conventional receivers, the lack of a PI code would prohibit the automatic detection of a station having the specified program content, but the up-down scanning sequence would be useful for speeding up the location of suitable stations. Also, the scanning sequences are equally useful for AM radio scanning.

Figure 4:
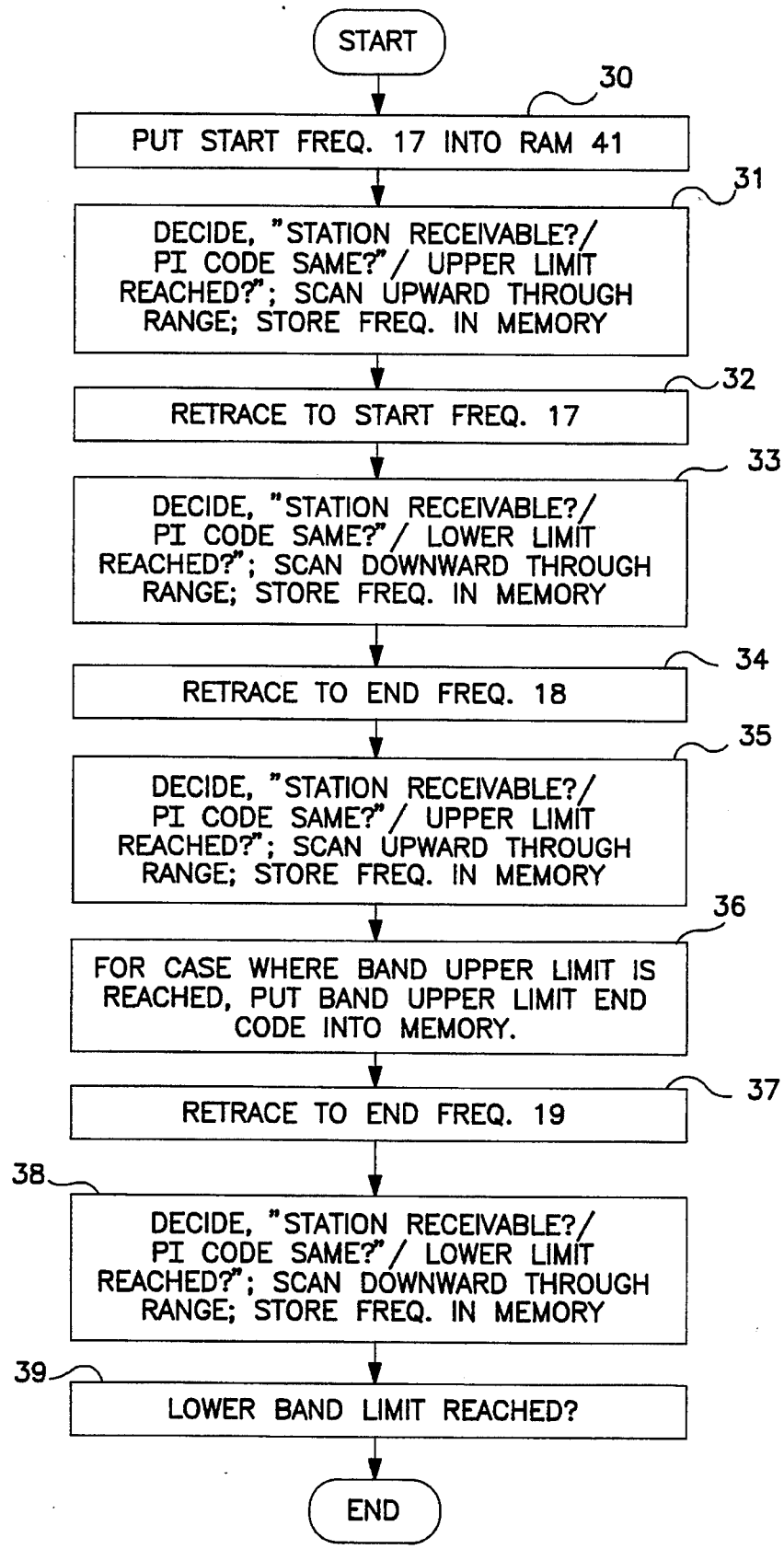
FIG. 4 is a top level flow chart of the operation of the embodiment in FIG. 2.

Referring to FIG. 4, control of the scanning sequences in FIG. 2 are explained in a flow chart.

At step 30, a start frequency 17 is stored in RAM 41. At step 31, three operations are performed. First, it is determined whether the present station is receivable. Second, the station's PI code is compared to the predetermined PI code. Third, it is determined whether the upper tuning limit is reached. Because upper tuning limit 25 is not reached, the system scans first upward scanning range 10 until first end frequency 18 is reached. When first end frequency 18 is reached, its frequency is stored in memory.

At step 32, the tuning is retraced downward to start frequency 17. At step 33, three operations are performed. First, it is determined whether the present station is receivable. Second, the station's PI code is compared to the predetermined PI code. Third, it is determined whether the lower tuning limit is reached. Because lower tuning limit 27 is not reached, the system scans first downward scanning range 11 until second end frequency 19 is reached. When second end frequency 19 is reached, its frequency is stored in memory.

At step 34, the tuning is retraced upward to first end frequency 18. At step 35, the system repeats the operations in step 31. The system scans second upward scanning range 12. Upper tuning limit 25 is reached. At step 36, upper tuning limit 25 is stored in memory.

At step 37, the tuning is retraced downward to second end frequency 19. At step 38, the system repeats the operations in step 33. Because upper tuning limit 25 is reached, the system continues the operations in step 33 by scanning second downward scanning range 13 and third downward scanning range 14 until lower tuning limit 27 is reached. The scan ends because both upper and lower limits have been reached.

Figure 5:
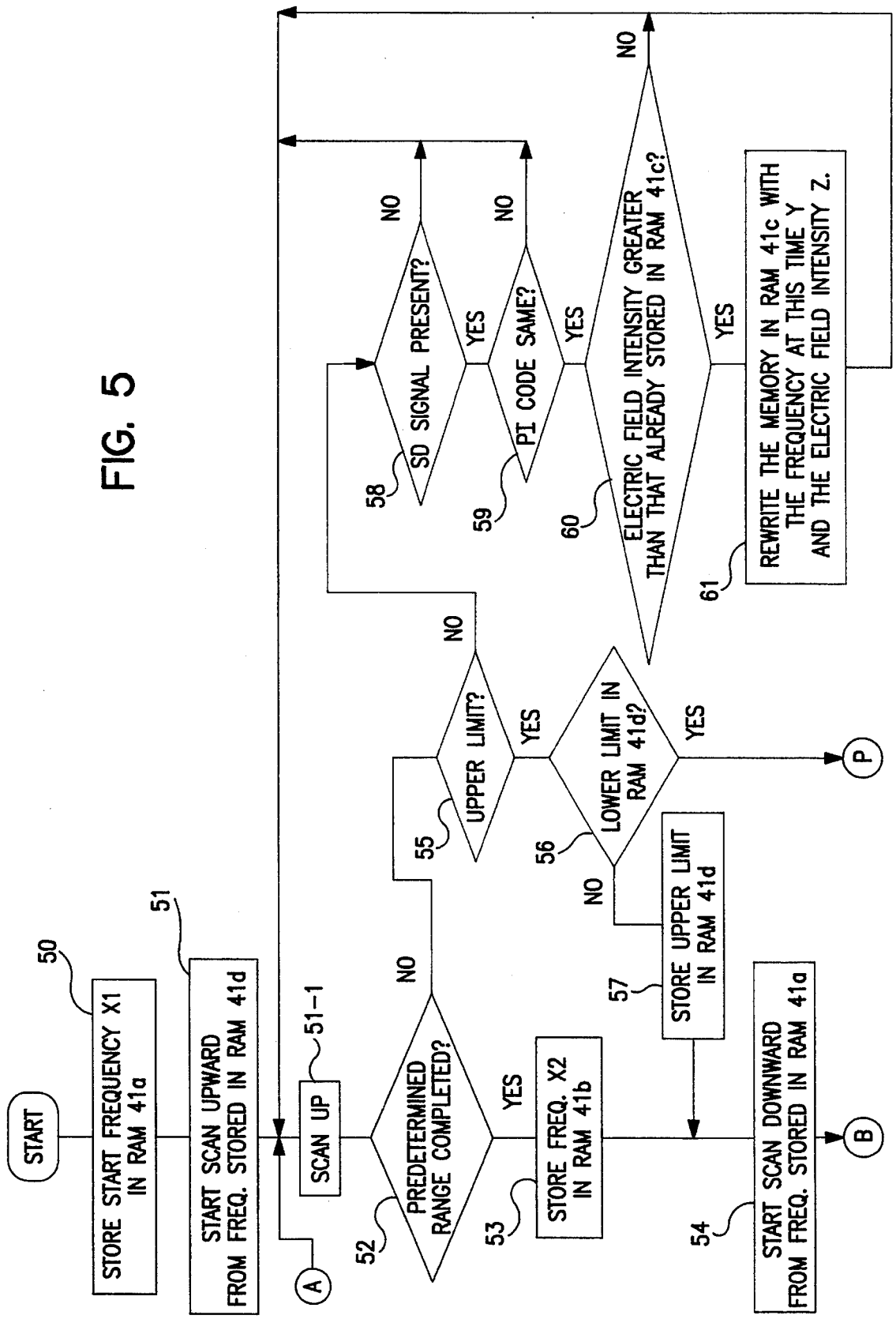
FIGS. 5 and 6 are in combination another flow chart of the operation of the embodiment in FIGS. 2 and 3.

Referring to FIG. 5, a detailed flow chart of an embodiment of the present invention in FIGS. 2 and 3 is described.

A start frequency X1 is stored in RAM 41a, and an electric field intensity at a time t is stored in RAM 41c (step 50). The scan starts from the frequency stored in RAM 41a (step 51). A predetermined range is scanned in an upward direction (step 51-1). It is then determined whether the predetermined range is scanned (step 52). The scan is finished when the scan reaches an end frequency of the predetermined range. If the end frequency is reached, its frequency X2 is stored in RAM 41b (step 53), and a downward scan starts from the frequency stored in RAM 41a (step 54).

At step 52, if the scan did not reach the end frequency, it is then determined whether an upper tuning limit is reached (step 55). If an upper tuning limit is reached, it is determined whether an SD signal is present (step 58). If the SD signal is present, the PI code is compared to the predetermined PI code (step 59). If the PI code is the same, it is determined whether the electric field intensity exceeds that of a predetermined intensity stored in RAM 41c (step 60). If it does, a frequency Y and its electric field intensity (signal strength, or S-meter signal strength) z are stored in RAM 41c (step 61).

At step 55, if an upper tuning limit is reached, it is determined whether a lower tuning limit (present in RAM 41d) is reached (step 56). If so, the process continues at step 72 in FIG. 6. If a lower tuning limit is not reached, the upper tuning limit is stored in RAM 41d (step 57) and the process continues at step 54. The system scans downward beginning at step 54.

Figure 6:
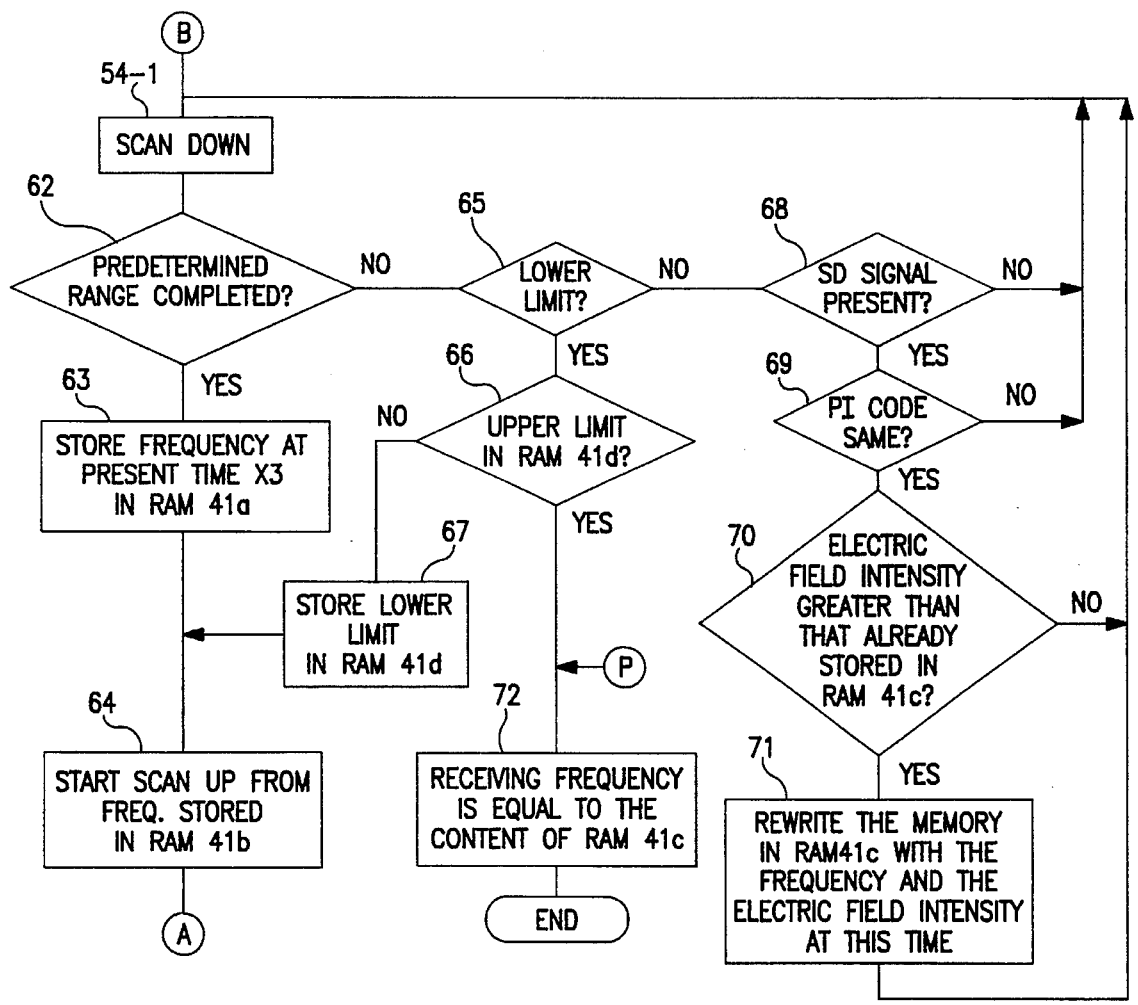

Referring to FIG. 6, a predetermined range is scanned in a downward direction (step 54-1). It is then determined whether the entire predetermined range is scanned (step 62). The scan is finished when the scan reaches an end frequency of the predetermined range. If an end frequency is reached, its frequency X3 is stored in RAM 41a (step 63), and an upward scan starts from the frequency stored in RAM 41b (step 64). The system returns to step 51-1 in FIG. 5.

At step 62, if a predetermined scan is not completed, it is then determined whether a lower tuning limit is reached (step 65). If a lower tuning limit is not reached, it is determined whether or not an SD signal is present (step 68). If the SD signal is present, the PI code is compared to the predetermined PI code. (step 69). If the PI code is the same, it is determined whether the electric field intensity exceeds that of a predetermined intensity stored in RAM 41c (step 70). If it does, a frequency Y and its electric field intensity z are stored in RAM 41c (step 71).

At step 65, if a lower tuning limit is reached, it is determined whether the upper tuning limit (present in RAM 41d) is reached (step 66). If not, the lower tuning limit is stored in RAM 41d (step 67), and the system continues to step 64. If an upper tuning limit in RAM 41d is present, the system continues at step 72.

At step 72, the receiving frequency of FM receiver 1 is the frequency stored in RAM 41c, and the system ends.

Figure 7:
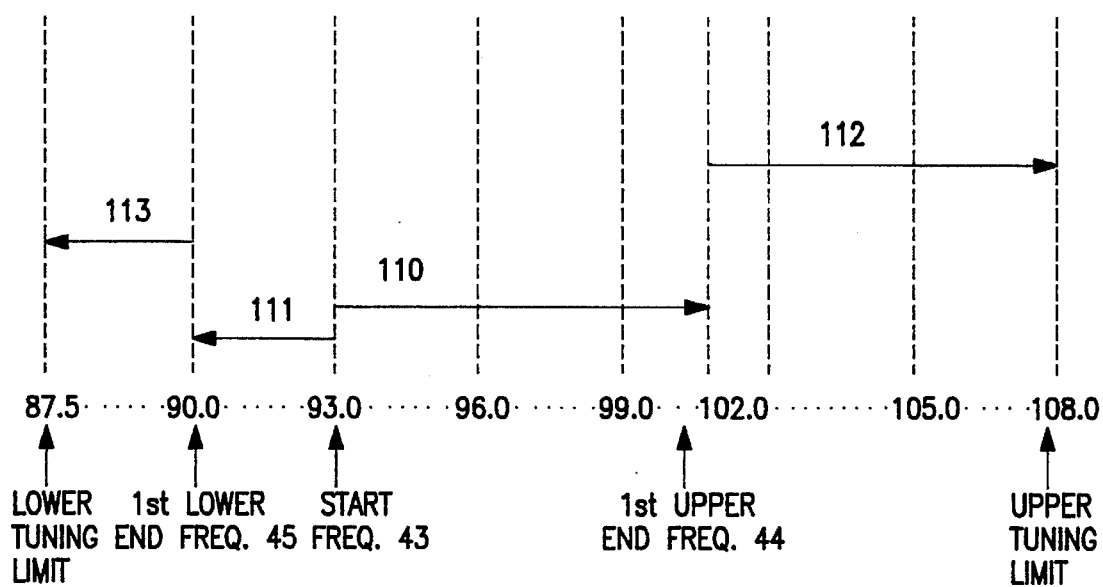
FIG. 7 is a scanning sequence for illustrating the operation of a second embodiment of the present invention, in which scanning proceeds to predetermined frequencies before reversing the scanning direction.

Referring to FIG. 7, a scanning sequence is shown in which seek or scan begins at a presently tuned start frequency 43, and continues upward to a predetermined first upper end frequency 44. Then tuning is retraced to start frequency 43, and continues downward to a first lower end frequency 45. Since tuning takes place to specific end frequencies rather than over specified tuning ranges, the upward and downward tuning ranges in FIG. 7 may be grossly different, as opposed to the approximately equal upward and downward tuning ranges in the embodiment of the invention shown in FIGS. 2 and 3.

For example, end frequencies of 101.0 MHz and 90.0 Mhz, and upper and lower tuning limits of 108.0 MHz and 87.5 MHz, respectively, are used for illustration. FM receiver 1 scans looking for an SD signal in an upward direction from a start frequency of 93.0 MHz. When the SD signal is received at, for example, a frequency of 99.0 MHz, if it is a receivable RDS station and its PI code matches a predetermined PI code, and if the seek function is in use, scanning stops at 99.0 MHz. If the scan function is in use, the signal strength and frequency of 99.0 MHz are stored, and scanning is resumed or continued to an end frequency of 101.0 MHz (step 110). If no matching PI code is found, or if the scan function is in use, the frequency is returned to the start frequency of 93.0 MHz and scanning is continued in a downward direction. If no receivable signal is received with the desired PI code, or if the scan function is in use, scanning continues to 90.0 MHz, which is the first lower end frequency 45 (step 111). The tuning is retraced upward to first upper end frequency 44. FM receiver 1 scans upward to the upper tuning limit of 108.0 MHz (step 112). When the upper tuning limit is reached, tuning is retraced downward to first lower end frequency 45. Finally, tuning is scanned downward to the lower tuning limit of 87.5 MHz (step 113).

If the scan function is in use, at the end of the scan operation described above, the stored frequency containing the desired PI code and the strongest signal strength is returned, the appropriate volume control signal is generated, and the listener receives the desired program.

Figure 8:
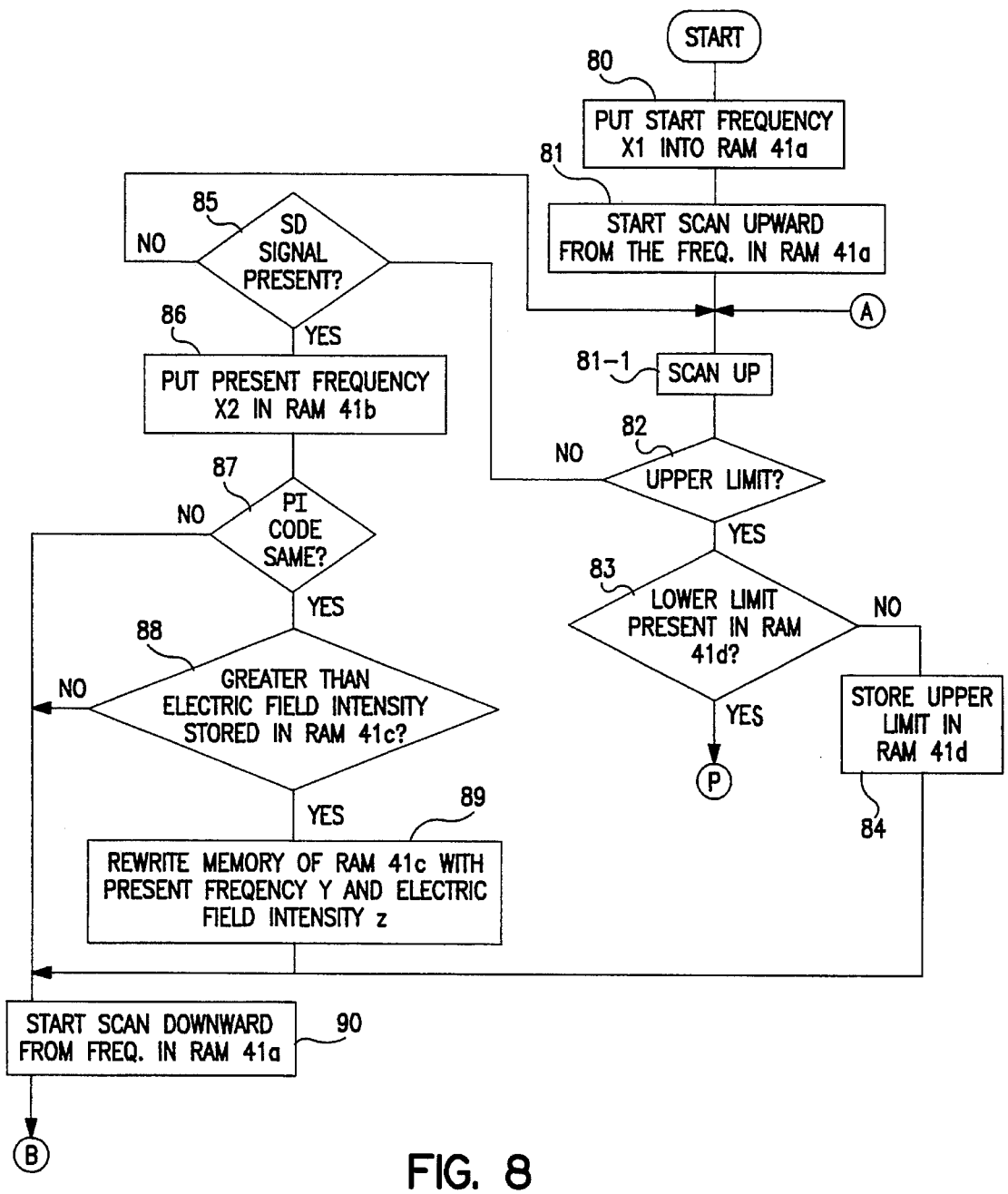
FIGS. 8 and 9 are in combination a flow chart of the operation of the embodiment in FIG. 7.

Referring to FIG. 8, a flow chart of the scan function described above is shown. A first start frequency X1 is stored in RAM 41a, and the electric field intensity (signal strength, or S-meter signal strength) z at this time is stored in RAM 41c (step 80). The scan starts from the frequency stored in RAM 41a (step 81). A predetermined range is scanned in an upward direction (step 81-1). Then, it is determined whether the upper tuning limit is reached (step 82). If the upper tuning limit is reached, it is determined whether a lower tuning limit (present in RAM 41d) is reached (step 83). If so, the process continues at step 93 in FIG. 9. If not, the fact that the upper tuning limit is reached is stored in RAM 41d (step 84), and the process continues to step 90.

If an upper tuning limit is not reached at step 82, it is then determined whether an SD signal is present (step 85). If present, the frequency at that time is stored in RAM 41b (step 86). Then, the PI code is compared to the predetermined PI code (step 87). If the PI code is the same, it is then determined whether the electric field intensity exceeds that of the intensity stored in RAM 41c (step 88). If it is greater, a current frequency Y and an electric field intensity z are stored in RAM 41c (step 89).

Figure 9:
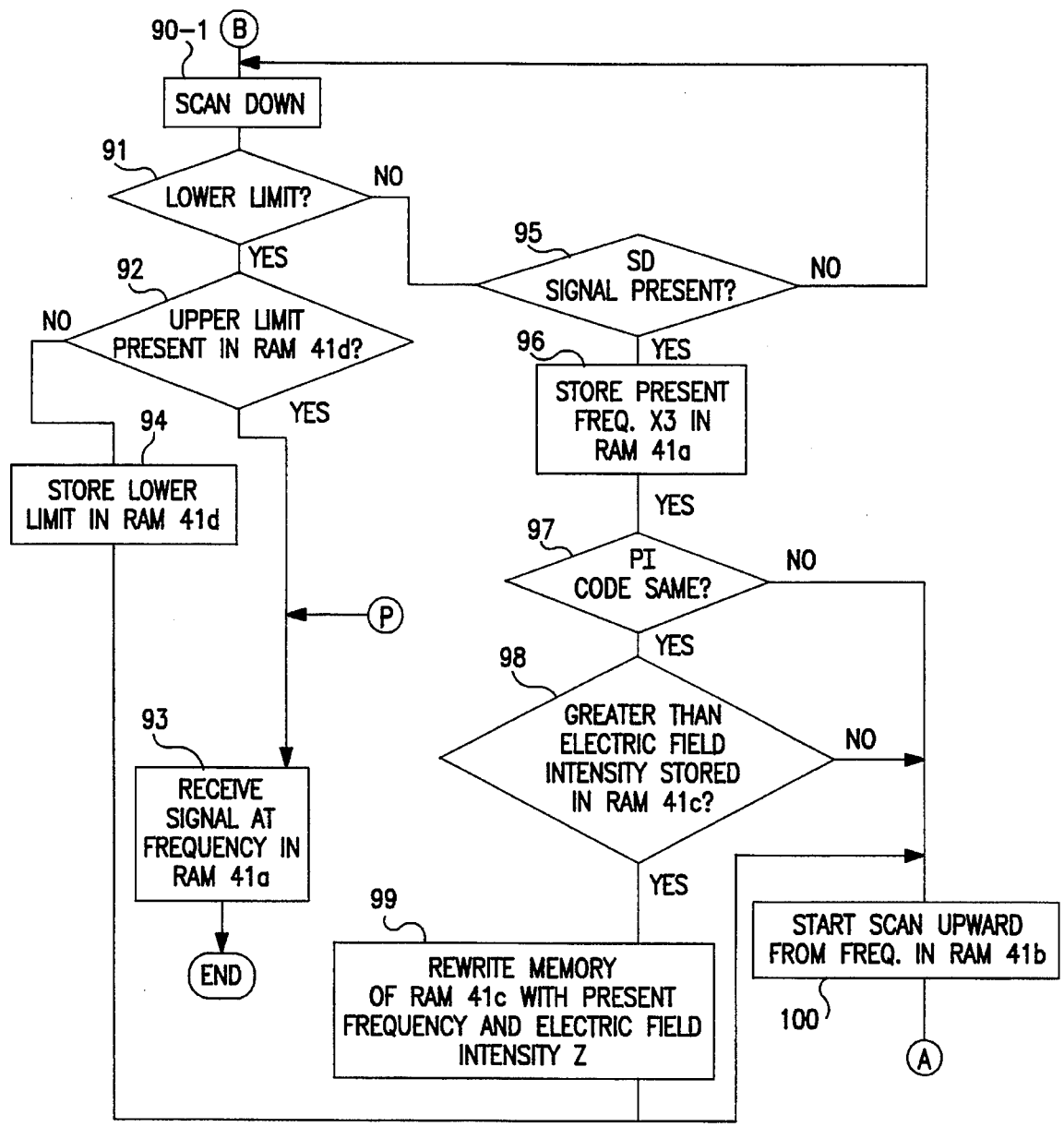

At step 87, if the PI code does not match the predetermined PI code, or the electric field intensity does not exceed what is in RAM 41c (step 88), a downward scan starts from the frequency stored in RAM 41a (step 90) and the process continues from a point B in FIG. 9.

Referring to FIG. 9, a predetermined range is scanned in a downward direction (step 90-1). Then, it is determined whether a lower tuning limit is reached (step 91). If a lower tuning limit is reached, it is determined whether there is an upper tuning limit present in RAM 41d (step 92). If so, the signal is received at the frequency in RAM 41a (step 93). If not, the lower tuning limit is stored in RAM 41d (step 94) and the process continues to step 100.

If the lower tuning limit is not reached at step 91, it is determined whether there is an SD signal present (step 95). If present, a frequency X3 at this time is stored in RAM 41a (step 96). Then the PI code is compared to the predetermined PI code (step 97). If it is the same, it is then determined whether the electric field intensity exceeds that of the intensity stored in RAM 41c (step 98). If it is greater, a current frequency Y and an electric field intensity z are stored in RAM 41c (step 99).

If at step 97 the PI code does not match, or at step 98 the electric field intensity does not exceed that of the intensity stored in RAM 41c, a downward scan starts from the frequency stored in RAM 41b (step 100), and the process continues from a point A in FIG. 8.

At step 93, the receiving frequency of FM receiver 1 is the frequency stored in RAM 41a, and the system ends.

Having described the preferred embodiments of the invention with reference to the accompanying drawings, it is to be understood that the invention is not limited to those particular embodiments, and that various changes and modifications may be effected therein by one skilled in the art without departing from either the scope or spirit of the invention as defined in the appended claims.

What is claimed is:

1. A receiver for tuning receivable frequencies, comprising:

means for tuning said receiver in a first direction from a first frequency to a first limit;

means for resuming tuning to said first frequency from said first limit, and then for resuming tuning from said first frequency in a second direction, opposite said first direction, to a second limit;

means for resuming tuning from said second limit to said first frequency;

means for resuming tuning in said first direction from said first frequency to one of a third frequency and an upper tuning limit, if said upper tuning limit is tuned before said third frequency is tuned;

means for resuming tuning from said third frequency or said upper tuning limit to said second limit; and means for resuming tuning in said second direction from said second limit to one of a fourth frequency and a lower tuning limit if said lower tuning limit is tuned before said fourth frequency is tuned.

2. A receiver according to claim 1, wherein:

said first limit is located at an end of a first predetermined frequency range above said first frequency; and said second limit is located at an end of a second predetermined frequency range below said first frequency.

3. A receiver according to claim 1, wherein:

said first limit is a first fixed frequency above said first frequency; and said second limit is a second fixed frequency below said first frequency.

4. A receiver according to claim 1, further comprising:

means for detecting that said upper tuning limit is reached; and wherein said means for resuming tuning in said second direction from said second limit to one of said fourth frequency and said lower tuning limit is, responsive to said upper tuning limit being reached to resume tuning to said lower tuning limit.

5. A receiver according to claim 1, further comprising:

means for detecting that said lower tuning limit is reached; and wherein said means for resuming tuning in said first direction from said first frequency to one of said third frequency and said upper tuning limit is responsive to said lower tuning limit being reached to resume tuning to said upper tuning limit.

6. A receiver according to claim 1, wherein said receivable frequencies contain an FM signal.

7. A receiver according to claim 1, wherein said receivable frequencies contain an AM signal.

8. A receiver according to claim 1, further comprising:

means for sensing a radio signal having at least a predetermined signal strength; and means for one of stopping said tuning at said radio signal and storing said predetermined signal strength and a frequency of said radio signal.

9. A receiver according to claim 8, further comprising:

means, when said predetermined signal strength and said frequency are stored, to continue said tuning and, whenever a signal strength, stronger signal strength than a stored signal strength is sensed, storing said stronger signal strength and a frequency related thereto; and at an end of said tuning, returning said tuning to a last stored frequency.

10. A receiver according to claim 9, further comprising:

means for producing an audio frequency signal from said radio signal;

means, responsive to said last stored frequency, for controlling a volume of said audio signal in response to a last stored signal strength.

11. A receiver according to claim 8, further comprising:

means for sensing a predetermined program identification code in said radio signal; and said means for stopping being responsive only to radio signals containing said predetermined program identification code.

* * * * *